US010009035B1

(12) United States Patent
LaCroix et al.

(10) Patent No.: US 10,009,035 B1
(45) Date of Patent: Jun. 26, 2018

(54) DYNAMIC CONTROL OF ADC RESOLUTION (71) Applicants: Marc-Andre LaCroix, Ottawa (CA); Semyon Lebedev, Ottawa (CA); Henry Wong, Ottawa (CA); Davide Tonietto, Ottawa (CA)

(72) Inventors: Marc-Andre LaCroix, Ottawa (CA); Semyon Lebedev, Ottawa (CA); Henry Wong, Ottawa (CA); Davide Tonietto, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days. days.

(21) Appl. No.: 15/495,572

(22) Filed: Apr. 24, 2017

(51) Int. Cl.
*H03M 1/06* (2006.01)
*H03M 1/08* (2006.01)
*H04B 1/38* (2015.01)
*H03M 1/12* (2006.01)
*H04L 25/06* (2006.01)
*H03M 1/00* (2006.01)

(52) U.S. Cl.
CPC ............... *H03M 1/08* (2013.01); *H04B 1/38* (2013.01); *H03M 1/00* (2013.01); *H03M 1/12* (2013.01); *H04L 25/067* (2013.01)

(58) Field of Classification Search
CPC .......... H03M 1/00; H03M 1/12; H04L 25/067
USPC ......... 341/118, 120, 155, 156, 122; 375/340
See application file for complete search history.

(56) References Cited

U.S. PATENT DOCUMENTS

| 5,122,800 A * | 6/1992 | Philipp ............... H03M 1/462 341/122 |
| 9,503,116 B2 * | 11/2016 | Speir .................. H03M 1/1019 |
| 2011/0013677 A1 * | 1/2011 | Ibrahim ............... H04B 1/406 375/219 |
| 2013/0016798 A1 * | 1/2013 | Velazquez ........... H04B 1/001 375/340 |

OTHER PUBLICATIONS

Rylov et al. "A 25Gb/s ADC-based serial line receiver in 32nm CMOS SOI", ISSCC2016.
Cui et al. "A 320mW 32Gb/s 8b ADC-based PAM-4 analog front-end with programmable gain control and analog peaking in 28nm CMOS", ISSCC 2016.
Gopalakrishnan et al. "A 40/50/100Gb/s PAM-4 Ethernet transceiver in 28nm CMOS", ISSCC 2016.

* cited by examiner

*Primary Examiner* — Joseph Lauture (57) ABSTRACT

Methods, systems and devices for dynamically controlling resolution of an analog-to-digital converter (ADC). The ADC receives an analog input signal and outputs digital data. A statistical unit coupled to the ADC obtains samples of the output signal and transmits a control signal to the ADC to adjust the resolution of the ADC. The control signal is generated by the statistical unit based on a comparison of at least one performance indicator with a target performance level. The at least one performance indicator is calculated using the samples.

20 Claims, 9 Drawing Sheets

DYNAMIC CONTROL OF ADC RESOLUTION

FIELD

The present disclosure relates to analog-to-digital converters (ADCs). In particular, the present disclosure relates to methods and systems for dynamic control of ADC resolution.

BACKGROUND

Figure 1A:
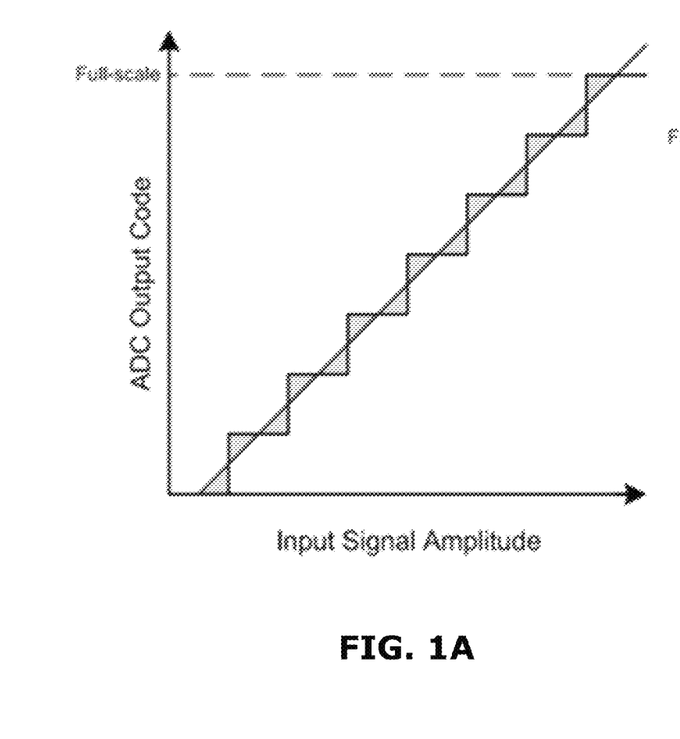
FIG. 1A illustrates quantization error for a 3-bit ADC.
Figure 1B:
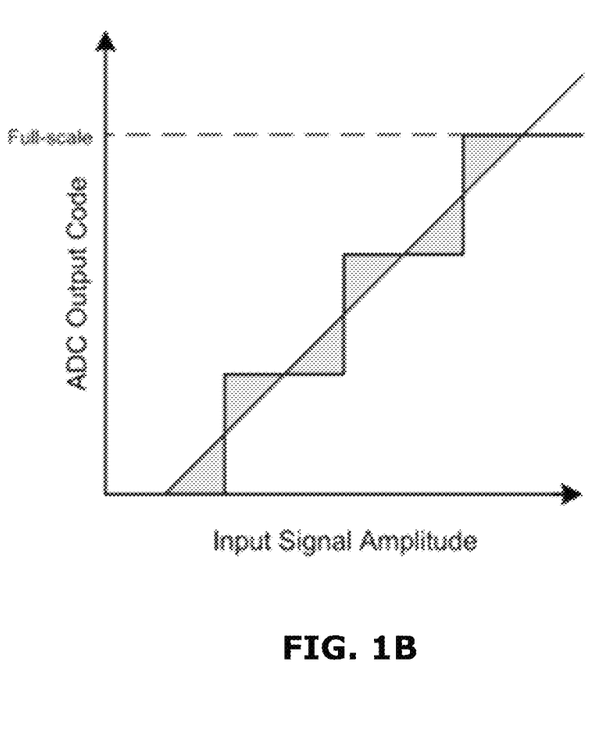
FIG. 1B illustrates quantization error for a 2-bit ADC.

An analog-to-digital converter (ADC) samples input analog data and converts each sample into an output of N-bit digital data. A higher resolution ADC has less quantization noise than a lower resolution ADC. This is illustrated in FIGS. 1A and 1B, in which the digital output of the ADC (solid line) is plotted against the analog input. The dotted line represents the ideal output that perfectly tracks the input, and the grey area represents the quantization noise due to digitization of the analog input. FIG. 1A illustrates the quantization noise of a 3-bit ADC and FIG. 1B illustrates that of a 2-bit ADC. Quantization noise, which is related to ADC resolution, contributes to signal-to-noise ratio (SNR) degradation of a communication link. Thus, the overall SNR requirement of the communication link should be considered when designing an ADC.

For a given sample rate, an ADC circuit having N-bit accuracy consumes power dependent on the resolution. Specifically, an ADC that has more conversion bits typically consumes more power.

Often, to simplify design efforts, the same N-bit resolution is used for all ADCs on a chip. This means that all ADCs on a chip are typically designed to satisfy the highest resolution requirement. However, individual ADCs on the chip may actually have lower resolution requirements. In those cases, least significant bit (LSB) outputs are generated but are not required. This leads to power waste in both the analog and digital domain.

SUMMARY

The present disclosure describes example circuits and systems that enable the resolution of an ADC to be variable and scalable, and to be dynamically controllable (e.g., during mission-mode operation). This may help to save energy. In particular, LSBs that are not required by the system are not produced. For example, in a successive approximation ADC, the internal asynchronous clock related to generation of the ADC output bits stops earlier, thus producing only the required number of bits to save power, keeping LSBs that are not required in reset mode.

The present disclosure also describes examples for dynamically controlling ADC resolution in a single-channel ADC implementation, as well as in an interleaved ADC implementation with multiple sub-ADCs (also referred to as sub-ADC channels) in which resolution of each sub-ADC may be independently and dynamically controlled.

According to some aspects, the present disclosure describes a system for dynamically controlling resolution of an analog-to-digital converter (ADC). The system includes the ADC for receiving an analog input signal and outputting digital data. The system also includes a statistical unit coupled to the ADC for obtaining samples of the output signal and transmitting a control signal to the ADC to adjust the resolution of the ADC. The control signal is generated by the statistical unit based on a comparison of at least one performance indicator with a target performance level. The at least one performance indicator is calculated using the samples.

According to an embodiment which can be combined with other embodiments disclosed herein, the present disclosure further describes a transceiver device including a transmitter for transmitting an output signal. The transceiver device also includes a receiver for receiving an analog input signal on an input channel. The receiver includes an analog-to-digital converter (ADC) for converting the analog input signal to digital data. The receiver also includes a statistical unit coupled to the ADC for obtaining samples of the digital data and transmitting a control signal to the ADC to adjust the resolution of the ADC. The control signal is generated by the statistical unit based on a comparison of at least one performance indicator with a target performance level of the receiver. The at least one performance indicator is calculated using the samples.

According to an embodiment which can be combined with other embodiments disclosed herein, the present disclosure further describes a system or a device wherein the ADC is an interleaved ADC having multiple sub-ADCs, each sub-ADC outputting respective digital data; and wherein the statistical unit obtains samples of the digital data output from each sub-ADC, calculates at least one performance indicator for each sub-ADC, and transmits the control signal to adjust the resolution of each sub-ADC independently of each other sub-ADC.

According to an embodiment which can be combined with other embodiments disclosed herein, the present disclosure further describes a system or a device wherein the ADC is an interleaved ADC having multiple sub-ADCs, each sub-ADC outputting respective digital data; and wherein the statistical unit obtains samples of the digital data output from each sub-ADC, calculates a group performance indicator for the sub-ADCs, and transmits the control signal to adjust the resolution of the sub-ADCs as a group.

According to an embodiment which can be combined with other embodiments disclosed herein, the present disclosure further describes a system or a device wherein the at least one performance indicator includes at least one of a signal-to-noise ratio (SNR) or a bit error rate (BER).

According to an embodiment which can be combined with other embodiments disclosed herein, the present disclosure further describes a system or a device wherein the ADC is a successive approximation ADC having a resolution, wherein the control signal adjusts the resolution of the ADC by controlling a number of comparisons performed by a comparator of the successive approximation ADC.

According to an embodiment which can be combined with other embodiments disclosed herein, the present disclosure further describes a system or a device further including a resolution control circuit for controlling the number of comparisons. The resolution control circuit is configured to count the number of comparisons performed by the comparator; and stop comparisons by the comparator when the number of comparisons performed by the comparator reaches a bit resolution specified by the control signal.

According to an embodiment which can be combined with other embodiments disclosed herein, the present disclosure further describes a method for dynamically adjusting the resolution of an analog-to-digital converter (ADC). The method includes receiving an analog input signal from an input channel. The method also includes converting the analog signal to digital data at a first bit resolution. The method also includes adjusting resolution of the ADC to match a target performance level. The method also includes continuing conversion of the analog signal at a second bit resolution.

According to an embodiment which can be combined with other embodiments disclosed herein, the present disclosure further describes a method wherein the ADC is an interleaved ADC having multiple sub-ADCs, each sub-ADC outputting respective digital data. The method further includes adjusting the resolution comprises adjusting resolution of each sub-ADC independently of each other sub-ADC.

According to an embodiment which can be combined with other embodiments disclosed herein, the present disclosure further describes a method wherein the resolution of each sub-ADC is adjusted to match a respective target performance level for each sub-ADC.

According to an embodiment which can be combined with other embodiments disclosed herein, the present disclosure further describes a method wherein the ADC is an interleaved ADC having multiple sub-ADCs, each sub-ADC outputting respective digital data. The method further includes adjusting the resolution comprises adjusting the resolution of the sub-ADCs as a group.

According to an embodiment which can be combined with other embodiments disclosed herein, the present disclosure further describes a method wherein the target performance level is a group target performance level.

According to an embodiment which can be combined with other embodiments disclosed herein, the present disclosure further describes a method wherein the target performance level includes at least one of a target signal-to-noise ratio (SNR) or a target bit error rate (BER).

According to an embodiment which can be combined with other embodiments disclosed herein, the present disclosure further describes a method wherein the ADC is a successive approximation ADC having a resolution, wherein adjusting the resolution of the ADC comprises controlling a number of comparisons performed by a comparator of the successive approximation ADC.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

The present disclosure describes example methods and systems that enable dynamic control of ADC resolution. Where there are multiple sub-ADCs in an interleaved ADC, the examples described herein may enable the resolution of each sub-ADC to be independently and dynamically controlled.

As the signal integrity changes, the ADC resolution may be dynamically controlled to change accordingly, to maintain signal-to-noise ratio (SNR) and/or bit error rate (BER) that satisfy the system requirements and at the same time keeping power consumption low. Control of the ADC resolution may also take place at initialization, where calculation of an initial SNR may be used to determine the appropriate resolution for the ADC, for example.

A transceiver device includes a transmitter and a receiver. The receiver may generally receive analog input signals over one or more input channels. An ADC-based receiver generally uses ADCs to convert the analog input signal to digital data, typically using one ADC per input channel. In some examples, the ADC is an interleaved ADC with multiple sub-ADCs (also referred to as sub-channels), where one input channel is sampled across the multiple sub-ADCs. The systems and methods for controlling ADC resolution may be implemented in a receiver portion of a transceiver device, or may be implemented in a receiver-only device. In some embodiments the programmable resolution ADC can be provided as part of a SerDes (serializer-deserializer) transceiver. The SerDes transceiver in some embodiments can be provided as an input/output (I/O) component of a semiconductor integrated chip (IC) design for wireline communication applications.

The ADC may be a successive approximation register (SAR) ADC. In the SAR ADC, conversion of the analog input signal to digital output may be stopped after a selected number of conversions to control the number of bits (and hence the bit resolution) of the output. Example implementations of this control are described further below.

The following discussion is provided in the context of an interleaved SAR ADC. However, the examples and methods described herein may also be implemented in a non-interleaved ADC (e.g., by implementing in the single channel of the non-interleaved ADC), as well as non-SAR ADCs. The present disclosure may also be applicable to Flash-based ADCs, for example.

Figure 2:
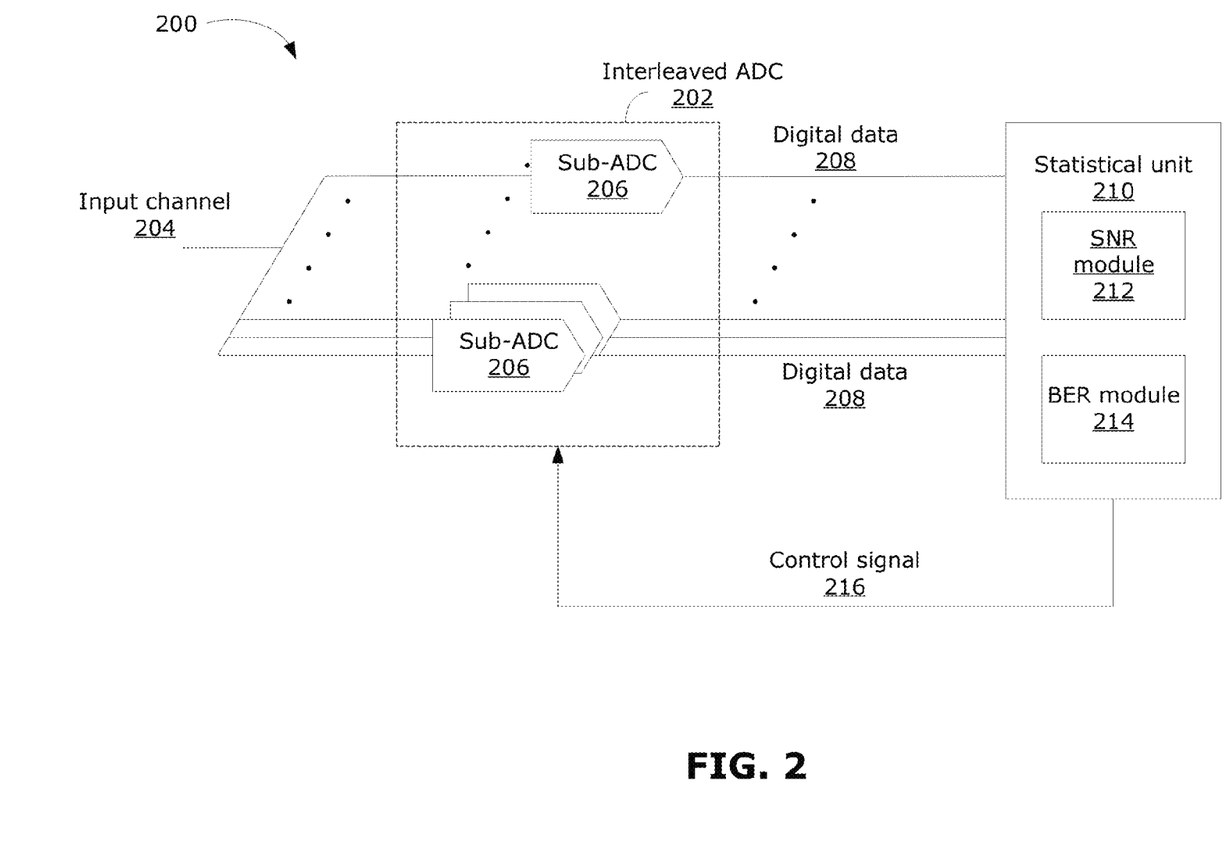
FIG. 2 is a schematic diagram of an example system for controlling resolution of an ADC.

FIG. 2 is a schematic diagram of an example system 200 for controlling resolution of an ADC. This example system 200 may be implemented in a receiver (e.g., part of a transceiver). FIG. 2 shows an interleaved ADC 202 for converting one input channel 204 (e.g., an optical channel or copper channel) of the receiver. Generally, a single receiver chip may have multiple input channels 204 (e.g., 250 input channels), with an interleaved ADC 202 for each input channel. Thus, there may be multiple instances of the system 200 implemented on a single multi-channel receiver chip.

The interleaved ADC 202 has K sub-ADCs 206 (e.g., 32, 64, 128 or more sub-ADCs) to sample the full incoming stream on the input channel, each sub-ADC 206 being capable of N-bit resolution. Typically, there are variations in performance between the sub-ADCs 206, such that, for example, one sub-ADC 206 may require a higher ADC resolution to satisfy the SNR and/or BER requirements of the system and a lower ADC resolution may suffice for another sub-ADC 206.

In operation, the system 200 receives analog input from the input channel 204. The sub-ADCs 206 of the interleaved ADC 202 perform analog-to-digital conversion to output digital data 208 at each sub-ADC 206. The bit resolution of each sub-ADC 206 is independently controlled (using a control signal as described below) so that a calculated performance indicator for each sub-ADC 206 satisfies a target performance level.

The target performance level may be fixed or variable. For example, the target performance level may be preset according to an overall system requirement (e.g., in order to satisfy performance requirements of the receiver). In such a case, the target performance level may be the same for all interleaved ADCs 202 across all input channels 204 of the receiver. The target performance level may also be variable, for example calculated based on a moving average of the sampled performance indicators (e.g., to reduce performance variations between sub-ADCs 206). A variable target performance level may enable the target performance level to be dynamically adjusted, for example for real-time response to changes in characteristics of an input channel 204.

The dynamic control of each sub-ADC 206 may be carried out by a statistical unit 210. The statistical unit 210 may also perform operations to determine whether the resolution of each sub-ADC 206 should be dynamically adjusted. For example, the statistical unit 210 may implement logic modules for calculating a performance indicator, such as SNR module 212 and/or BER module 214, and compare the performance indicator with the target performance level. The statistical unit 210 then outputs a control signal 216 to control the resolution of each sub-ADC 206.

The statistical unit 210 may be provided on the same chip as the interleaved ADC 202. The statistical unit 210 samples the digital data 208 output from each sub-ADC 206 and determines at least one performance indicator for each sub-ADC. The performance indicator may also be determined for all the sub-ADCs 206 together as a group, or for some of the sub-ADCs 206 together as a sub-group, as discussed further below. The digital data 208 may also be used by other components on or off the chip, for example various filters of a digital signal processor (DSP), of which the statistical unit 210 may be a part, on or off the chip.

In the example of FIG. 2, the statistical unit 210 uses the SNR module 212 and the BER module 214 to calculate SNR and BER as performance indicators for each sub-ADC 206. The calculated performance indicator is then compared to the target performance level (e.g., target SNR and/or BER) and the statistical unit 210 outputs the control signal 216 to adjust the resolution of the sub-ADCs 206 accordingly. The sampling of the digital data 208 by the statistical unit 210 and the output of the control signal 216 may be performed on a periodic basis, continuously or asynchronously. In some examples, the operations of the statistical unit 210 may be carried out when a trigger event is detected, such as a change in temperature or supply voltage that exceeds a threshold amount.

The bit resolution for each sub-ADC 206 may be dynamically controlled, via the control signal 216. For example, the control signal 216 may be a vector, and the control signal 216 may be appropriately bit-shifted for each sub-ADC 206 to provide the correct control signal (e.g., a control voltage or a control current, or a control signal that is convertible to a control voltage or current) to each sub-ADC 206.

Thus, the bit resolution may be increased for an underperforming sub-ADC 206 whereas the bit resolution may be decreased for a high performing sub-ADC 206. Because different sub-ADCs 206 may be differently affected by environmental changes (e.g., due to variations during fabrication and/or design), a given environmental change (e.g., increase or decrease in temperature) may cause different amounts of performance changes in different sub-ADCs 206. Thus, the ability to adjust the resolution of each sub-ADC 206 independently may be useful even in the event of an environmental change that is experienced by all sub-ADCs 206.

Although the control signal 216 enables the resolution of each sub-ADC 206 to be independently adjusted, in some examples the control signal 216 may also cause the resolution of all sub-ADCs 206 to be adjusted together. For example, a change in the characteristics of the input channel 204 may cause the output of all sub-ADCs 206 to exhibit the same increase or decrease in performance. The statistical unit 210 may thus determine that the resolution for all sub-ADCs 206 should be decreased or increased accordingly, to meet the target performance level.

In some examples, the target performance level that the calculated performance indicators of the sub-ADCs 206 are compared against may be preset for all input channels 204 of the chip or individually set for each input channel 204. Generally, all receivers of a transceiver system may be required to meet a minimum system-wide performance requirement (e.g., minimum SNR and/or BER requirement) that may be predetermined. This, in turn, may be reflected in a target performance level for all sub-ADCs 206 of the receiver that at least meets the minimum system-wide performance requirement. The target performance level may be set higher than the system-wide performance requirement, to enable a performance margin (e.g., to account for changes in the channel) and/or to enable flexibility between different applications. The performance of the ADC as a whole may be compared to the target performance level, to adjust ADC-wide resolution. The performance of sub-ADCs 206 of the ADC may also be individually compared to a target performance level that is set for the ADC as a whole, and the resolution of each sub-ADC 206 may be individually controlled accordingly. This may help to reduce performance variability between the sub-ADCs 206 of the interleaved ADC.

Although FIG. 2 illustrates a single statistical unit 210 being used for all sub-ADCs 206 of the interleaved ADC 202, in some examples there may be multiple instances of the statistical unit 210, for example each sub-ADC 206 may be sampled and controlled by a respective statistical unit 210 or respective statistical sub-unit (not shown) within the statistical unit 210. In this case, the control signal 216 output by each sub-unit of the statistical unit 210 may be a single voltage level, rather than a vector, for controlling the ADC resolution of each respective sub-ADC 206. In some examples, the control signals 216 intended for different sub-ADCs 206 may be time-interleaved together onto a common bus. Other variations may be used as appropriate to implement the control signal 216.

Figure 3:
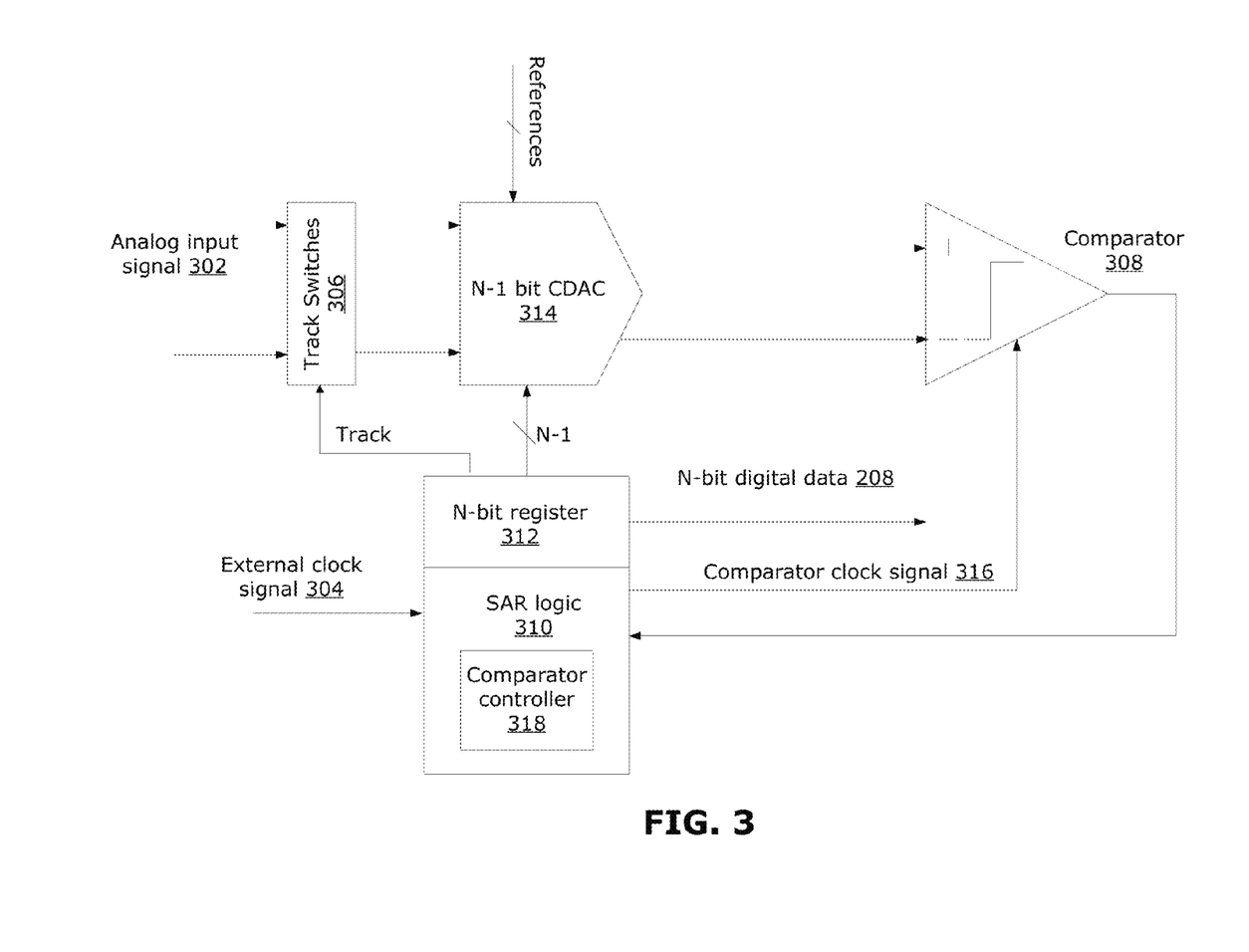
FIG. 3 is a schematic diagram showing an example asynchronous SAR ADC.

FIG. 3 is a schematic diagram showing an example asynchronous SAR ADC 300. The bit resolution of the asynchronous SAR ADC 300 may be controlled using the example system 200 described above. For simplicity, the asynchronous SAR ADC 300 is shown and described with respective to one sub-ADC. However, it should be understood that the control of bit resolution described below may be implemented in synchronous and asynchronous SAR ADCs, with one or many sub-ADCs.

In this example, the asynchronous SAR ADC 300 converts N-bits. The asynchronous SAR ADC 300 receives as input analog input signals 302 to be converted to digital, and an external clock signal 304. The asynchronous SAR ADC 300 includes track switches 306, a comparator 308, a SAR logic circuit 310, an N-bit register 312, and an N−1 bit capacitor digital-to-analog converter (CDAC) 314. The output of the asynchronous SAR ADC 300 is the N-bit digital data 208 (beginning with the most significant bit (MSB)), converted from the analog input signals 302. The external clock signal 304 triggers the beginning of a SAR conversion at the SAR logic circuit 310, then the SAR logic circuit 310 generates an internal comparator clock signal 316 (which is asynchronous in the example of the asynchronous SAR ADC 300), which can be a single clock or multiple clocks in succession. The comparator clock signal 316 is provided as input to the comparator 308.

In both synchronous and asynchronous SAR ADCs, the bit resolution can be adjusted by controlling the number of times the comparator 308 is enabled, where each additional comparison at the comparator 308 corresponds to a 1-bit increase in resolution. By stopping the comparator 308 after a certain number of comparisons, a desired bit resolution may be achieved.

The SAR logic circuit 310 may implement a comparator controller 318 to control output of the comparator clock signal 316 that enables the comparator 308. By controlling the number of times the comparator 308 is enabled, the bit resolution of the SAR ADC may be controlled (e.g., enable the comparator 308 5 times for a 5-bit resolution). However, in the asynchronous SAR ADC 300, the time for each bit sub-cycle may be dependent on the internal convergence time of the N−1 bit CDAC 314, and other analog delays within the loop.

Figure 4:
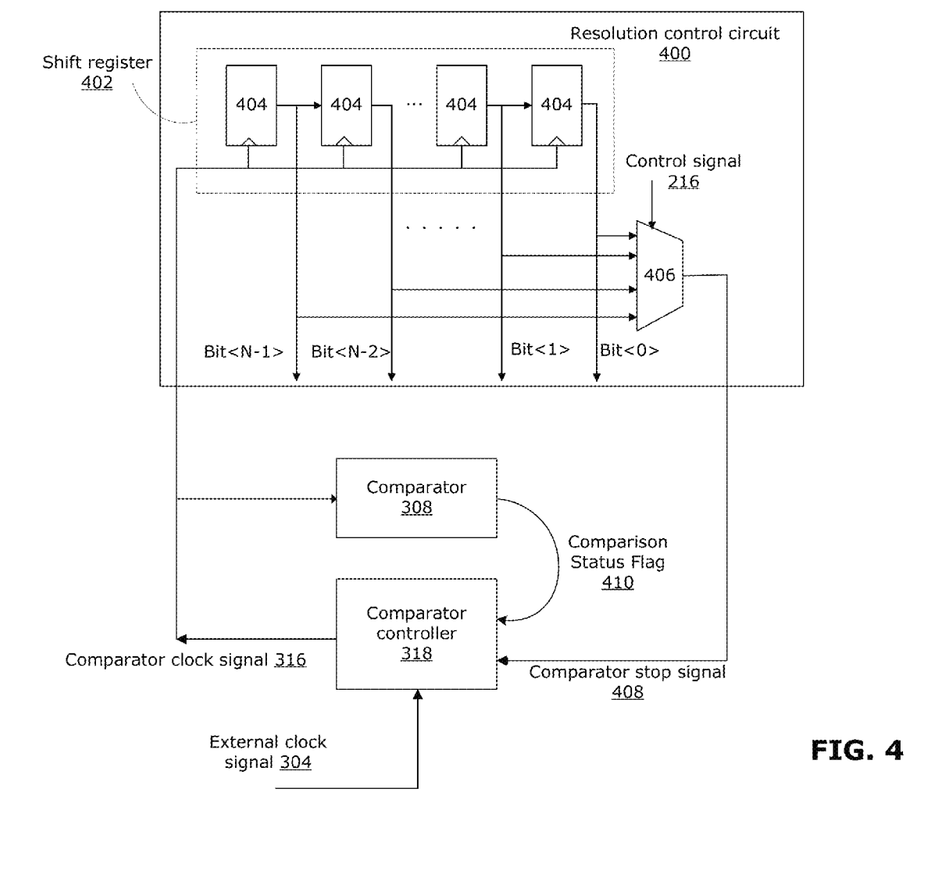
FIG. 4 is a schematic diagram illustrating an example of a resolution control circuit that counts the number of comparisons in a SAR ADC.

Thus, the number of times that the comparator 308 is enabled cannot be controlled by simply stopping the comparator 308 after a certain period of time, instead, it may be necessary to count the number of times the comparator 308 was enabled. FIG. 4 is a schematic diagram illustrating an example of a resolution control circuit 400 that performs this counting function.

For simplicity, FIG. 4 shows only the comparator 308 and the comparator controller 318 from FIG. 3, however it should be understood that the example shown in FIG. 4 may be implemented within the example of FIG. 3.

The resolution control circuit 400 may be implemented to count the number of times the comparator 308 is enabled (e.g., counting the number of cycles of the comparator clock signal 316) during one cycle of the external clock signal 304, and to stop the number of comparisons performed by the comparator 308 when a desired bit resolution is achieved, in accordance with the control signal 216. The comparator 308 may transmit a comparison status flag 410 to the comparator controller 318 when the comparator 308 has finished operation on the input corresponding to the current bit. The comparator controller 318 then begins the process for the next bit in the conversion cycle.

In the example shown, the resolution control circuit 400 uses a shift register 402 to perform the counting function. The shift register 402 may be a modified version of the typical N-bit register 312 (see FIG. 3) of a SAR ADC, with the addition of the selection mechanism described below. A logical "1" is applied to the first flip-flop 404 (corresponding to the MSB) of the shift register 402 when the first comparison is enabled by the comparator clock signal 316. This value progressively shifts down the chain of the shift register 402 during successive comparisons. The number of flip-flops 404 in the shift register 402 corresponds to the maximum bit resolution of the asynchronous SAR ADC 300. When the full N-bit resolution of the asynchronous SAR ADC 300 is outputted, the shift register 402 will fill up. The control signal 216 from the statistical unit 210 (see FIG. 2) controls a multiplexer (MUX) 406 to select the flip-flop 404 corresponding to the desired number of bits. For example, for a 1-bit resolution, the control signal 216 controls the MUX 406 to select the first flip-flop 404 (corresponding to bit N−1); for a 2-bit resolution, the control signal 216 controls the MUX 406 to select the second flip-flop 404 (corresponding to bit N−2); and so forth.

As previously noted, in some examples the control signal 216 may include information to select a particular sub-ADC 206 (e.g., a sub-ADC selection signal, which may be similar in function to an address bus) and information to control the bit resolution for that particular sub-ADC (e.g., a resolution control code). The bit resolution specified by the control signal 216 may be applied to the MUX 406 of a particular sub-ADC 206 only when the control signal 216 is indicated for the particular sub-ADC 206. For example, there may be a local latch (not shown) within the sub-ADC 206 that is used to store the resolution control code for the MUX 406. Writing to the local latch may be gated by sub-ADC selection signal. The resolution control code may be used to select which input to the MUX 406 is used as the signal to stop comparisons. Other methods for addressing a sub-ADC 206 and changing the resolution setting for a particular sub-ADC 206 may be used.

The output of the MUX 406 output is a comparator stop signal 408 that is provided to the comparator controller 318. When the comparator stop signal 408 is received by the comparator controller 318, all conversion operation in the asynchronous SAR ADC 300 is stopped and the N−1 bit CDAC 314 (see FIG. 3) is readied (e.g., reset) for the next sample.

In a typical synchronous SAR ADC (not shown) the comparisons at the comparator occur at regular intervals dictated by an internal synchronous clock provided to the comparator. Because the timing of the comparisons are at known intervals of time, the bit resolution can be controlled by the comparator controller stopping the comparator after a predetermined number of these clock cycles, corresponding to the desired number of bits (e.g., 5 clock cycles to achieve a 5-bit resolution). For example, a programmable counter may be controlled by the control signal 216 from the statistical unit 210 (see FIG. 2) to output the comparator stop signal to the comparator controller after the counter reaches the predetermined number of clock cycles. This may enable the bit resolution of a synchronous SAR ADC to be controlled without using the resolution controller 400 of FIG. 4. In some examples, the resolution controller 400 of FIG. 4 may be also be used for a synchronous SAR ADC.

Although described with reference to a single N-bit digital output, each sub-ADC of the interleaved ADC 202 (see FIG. 2) may be controlled in the manner described above (e.g., by implementing the example circuits in each sub-ADC) to achieve a selected bit resolution, in accordance with the control signal 216.

Figure 5:
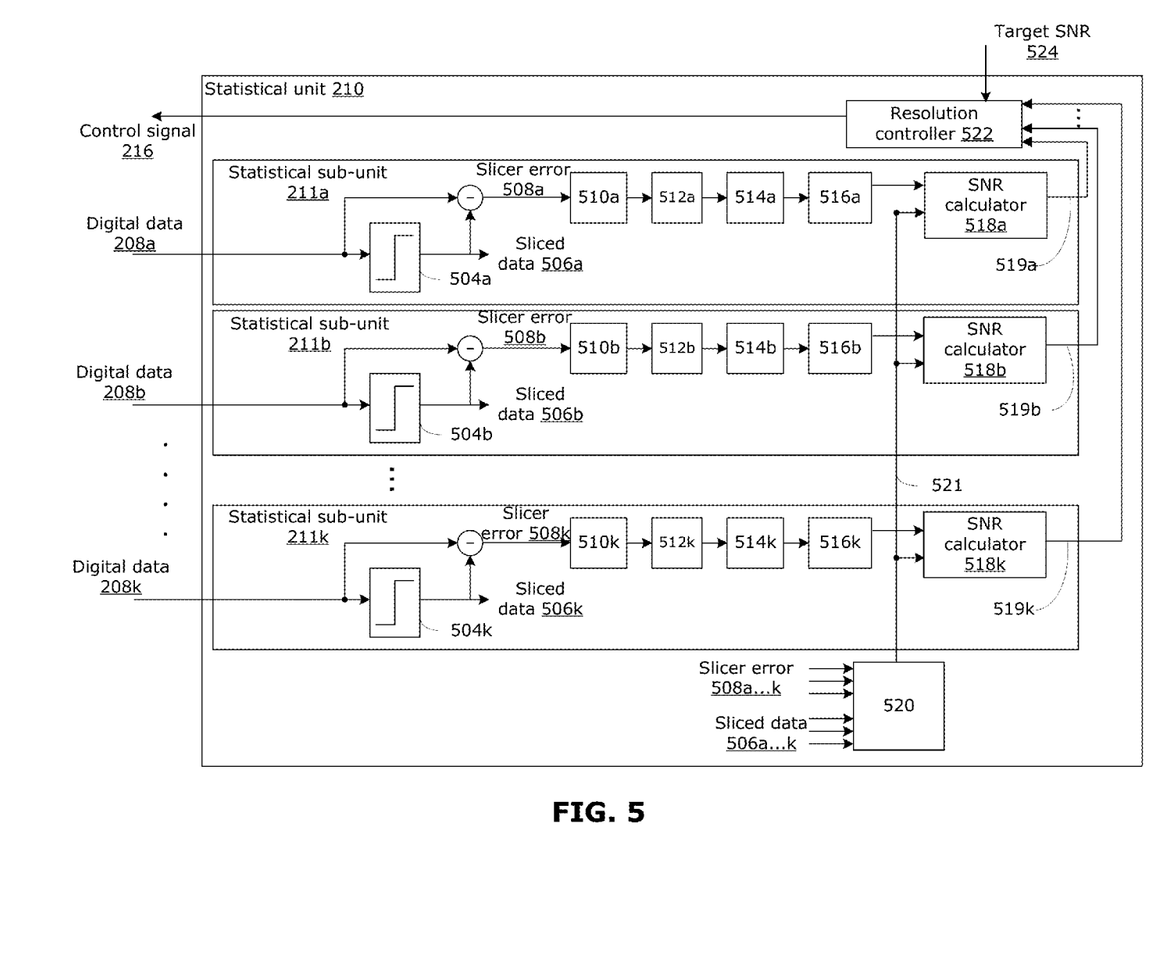
FIG. 5 shows an example implementation in which a statistical unit calculates the SNR for each sub-ADC of an interleaved ADC separately.
Figure 6:
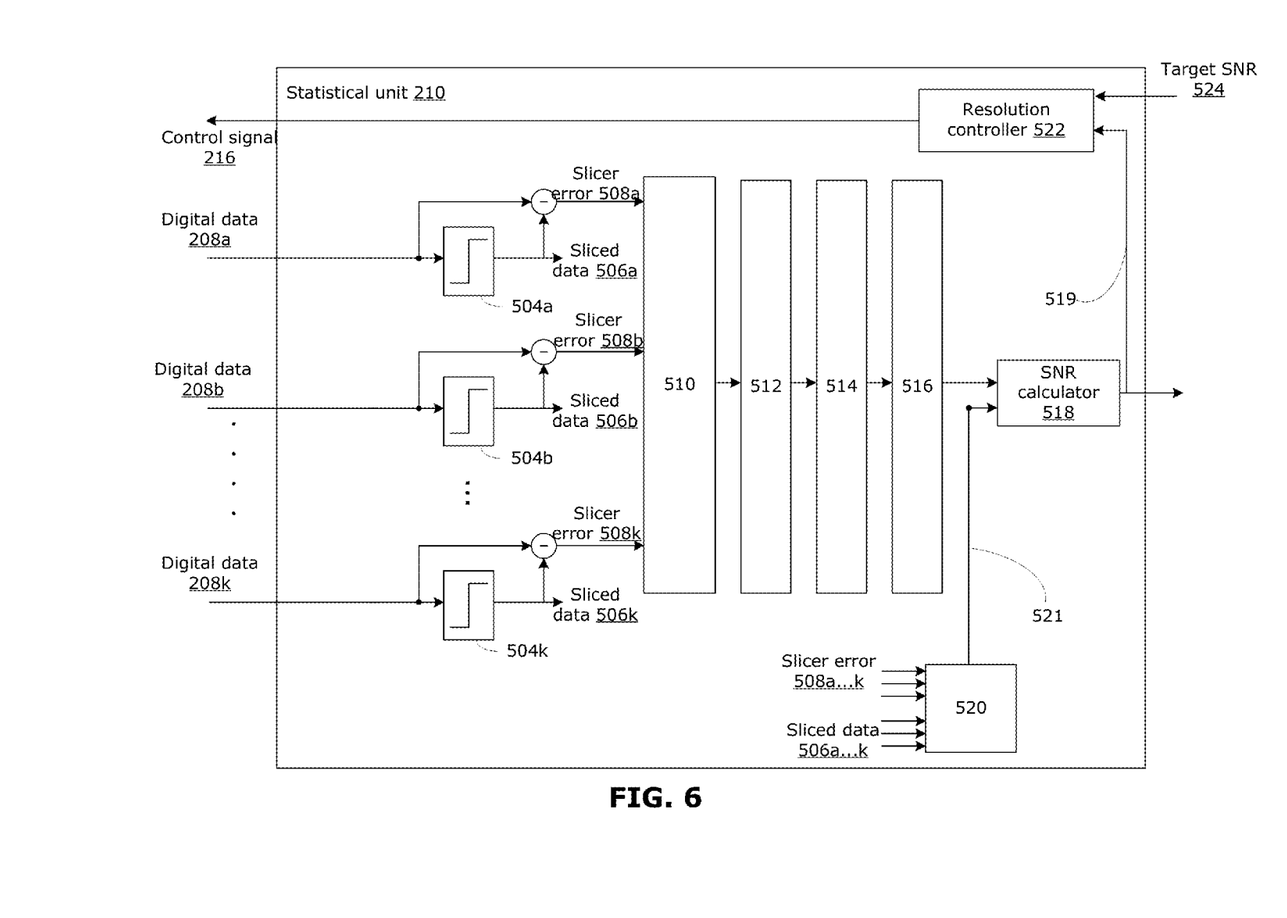
FIG. 6 shows an example implementation in which a statistical unit calculates the SNR for all sub-ADCs of an interleaved ADC grouped together.

Reference is made again to FIG. 2. As described above, the statistical unit 210 performs calculations on the sampled output from each sub-ADC 206. FIGS. 5 and 6 are schematic diagrams illustrating two examples of how the statistical unit 210 may implement the SNR module 212.

FIG. 5 shows an example implementation in which the statistical unit 210 calculates the SNR for each sub-ADC 206 separately, in this case using statistical sub-units 211a . . . k (generally referred to as sub-unit 211). Statistical sub-units 211 are shown in FIG. 5, however the statistical sub-units 211 may only be conceptual and may not be actually implemented. For example, the statistical unit 210 may calculate the SNR for each sub-ADC 206 separately, without requiring separate statistical sub-units 211. FIG. 6 shows an example implementation in which the statistical unit 210 calculates the SNR for all sub-ADCs 206 grouped together. In some examples, the functional blocks shown in FIGS. 5 and 6 may be implemented within the DSP of a transceiver system, for example using dedicated circuitry. Other implementations of FIGS. 5 and 6 may be used as appropriate.

Although not shown, in other examples the statistical unit 210 may calculate the SNR both for each sub-ADC 206 individually as well as for all sub-ADCs 206 together. The SNR calculation in the examples of FIGS. 5 and 6 are similar, the difference being whether the calculation is performed for each sub-ADC 206 individually or all sub-ADCs 206 together as a group. In some examples, the calculation may be performed for some (but not all) of the sub-ADCs 206 as a sub-group. The following description applies to both FIGS. 5 and 6.

Each bit of the digital data 208a . . . k (generally referred to as digital data 208) from each sub-ADC 206 of the interleaved ADC 202 (see FIG. 2) is inputted to a respective slicer 504a . . . k (generally referred to as slicer 504) for determining the received symbol values. For example, for pulse amplitude modulation (PAM)-4 modulation, the transmitted (and received) symbol values can be labeled as {−3, −1, 1, 3}. The output of each slicer 504 is N-bit sliced data 506a . . . k (which may be referred to as sliced data1 corresponding to the first sub-ADC, to sliced dataK corresponding to the K-th sub-ADC, and generally referred to as sliced data 506). The difference between the input of each slicer 504 and the sliced data 506 is the N-bit slicer error 508a . . . k (generally referred to as slicer error 508), and represents noise. It is this slicer error 508 that is used to calculate noise statistic, which is in turn used for the SNR calculation. A series of digital processing is described below to perform the SNR calculation. In the example of FIG. 5, this digital processing and SNR calculation is performed on the slicer error 508 of each sub-ADC 206 individually, for example using statistical sub-units 211; in the example of FIG. 6, the digital processing and SNR calculation is performed on the sum of the slicer error 508 of all sub-ADCs 206 together as a group. In some examples, the digital processing and SNR calculation may be performed on sub-groups of sub-ADCs 206 (e.g., groups of 2 or 5 sub-ADCs together, or sub-groups of different numbers of sub-ADCs 206), or a combination of individual sub-ADCs 206 and sub-groups of sub-ADCs 206. The configurations illustrated in FIGS. 5 and 6 may be adapted to perform digital processing and SNR calculations for such sub-groups.

The slicer error 508 can be a high-precision value that is represented by many bits. To reduce digital gate-count complexity, the slicer error 508 is truncated and/or clipped at 510a . . . k, 510 (generally referred to as 510), in order to reduce the multi-bit requirement of further digital processing. Then, at 512a . . . k, 512 (generally referred to as 512) the absolute value is taken for the truncated error value. The absolute value of each slicer error is then summed at 514a . . . k, 514 (generally referred to as 514). The summation output is again truncated at 516a . . . k, 516 (generally referred to as 516), in order to reduce the hardware requirement in further processing of the noise statistic. The processed noise is inputted to the SNR calculator 518a . . . k, 518 (generally referred to as the SNR calculator 518). The SNR calculation performed by the SNR calculator 518, whether considering sub-ADCs individually (as in FIG. 5) or together as a group (as in FIG. 6) may be similar.

Also present in the statistical unit 210 (or as part of the general adaptation engine) is a logical block 520 used to adapt the main cursor (during mission-mode operation). The logical block 520 outputs a signal 521 to the SNR calculator 518, representing the adapted main cursor. The logical block 520 may be part of an adaptation engine, which may be integrated with the DSP of a transceiver system, and which may function to equalize the communication channels of the transceiver. The main cursor is the height of an eye in an eye diagram, divided by two. The main cursor may also be referred to as half eye height. The main cursor is a value that represents the strength of a signal passed through a channel, and is typically attenuated after the signal has passed through the channel (e.g., due to channel loss). Generally, the attenuation of the main cursor depends on the loss of the channel, and may range from a few dBs to over 40 dB, for example. Because there is no a priori knowledge of the channel loss, the adaptation engine of the receiver is used to autonomously determine the value of the main cursor (e.g., using a least-mean squares algorithm). Although the signal that is received is typically very noisy, the value of the main cursor may be statistically determined, and this value represents the strength of the received signal and may be used for SNR calculation by the SNR calculator 518. The main cursor may have other uses, such as for equalizing the channels of the transceiver.

In adapting the main cursor, the slicer error 508 of each ADC sub-ADC 206 and the sliced data 506 of each ADC sub-ADC 206 are used. Once the adaptation of the main cursor demonstrates stability, the main cursor statistic is used for SNR calculation by the SNR calculator 518 as follows:

$$SNR = \frac{S}{N} = \left(\frac{\text{Main Cursor statistic}}{\text{Noise statistic}}\right)$$

As shown in FIGS. 5 and 6, there may be only one global main cursor. However, there may be K individual slicer errors 508a . . . k (corresponding to the K sub-ADCs 206). The global main cursor is used with each individual slicer error 508a . . . k, in order to calculate the corresponding SNR for each sub-ADC 206 in the example of FIG. 5.

The output of the SNR calculator 518 is the SNR metric 519 (individual SNR metrics 519a . . . k for each sub-ADC 206, in the example of FIG. 5; and a SNR metric 519 for all sub-ADCs 206 together, in the example of FIG. 6), which may be used as an input parameter to a resolution controller 522. The SNR metric 519a . . . k, 519 (generally referred to as SNR metric 519) may also be used by other parts of the system, such as for equalization control among other uses. The resolution controller 522 may compare the SNR metric 519 with a target SNR 524 (which may be preset and fixed, or may be variable) to determine how many bits of resolution each sub-ADC 206 should use (e.g., according to the condition of the input channel, and according to characteristics of each sub-ADC such as sub-ADC noise, jitter and nonlinearity) and generate the control signal 216 accordingly.

In the example of FIG. 5, the resolution controller 522 may compare the SNR metric 519 for each sub-ADC 206 with a respective target SNR 524 for each sub-ADC 206 or the same target SNR 524 for all sub-ADCs 206 and generate the control signal 216 to control the bit resolution of each sub-ADC 206 individually. In the example of FIG. 6, the resolution controller 522 may compare the group SNR metric 519 with a single target SNR 524 and generate the control signal 216 to control the bit resolution of all sub-ADCs 206 together. In some examples, instead of a resolution controller 522 in the statistical unit 210, a higher software layer may be used to determine the bit resolution.

Figure 7:
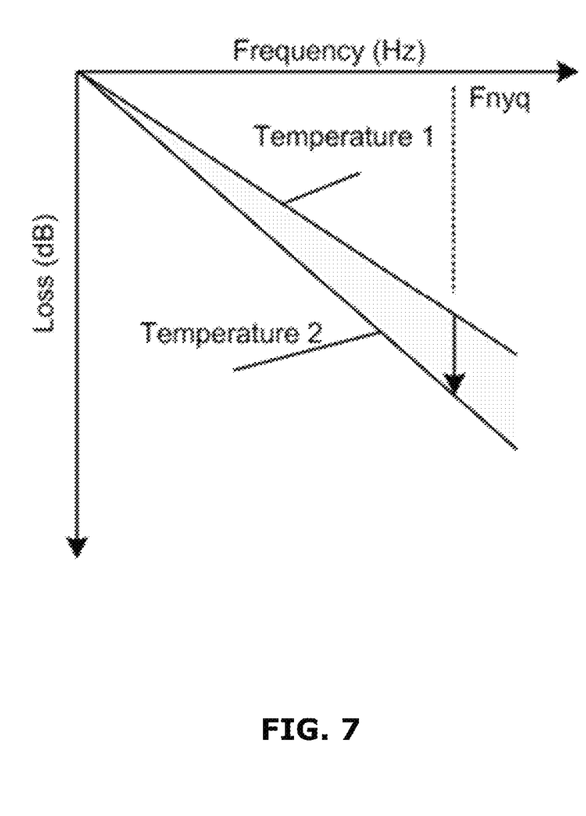
FIG. 7 is a plot that illustrates how a change in environmental temperature may cause a change in the characteristics of a given input channel.

FIG. 7 is a plot that illustrates how a change in environmental temperature may cause a change in the characteristics of a given input channel. In a serial communication infrastructure system, channel loss may vary significantly with temperature, as shown in FIG. 7. The example systems described above may be used to dynamically adjust the ADC resolution in response to this change, in order to maintain a target performance level (e.g., a target overall SNR or BER for the system). For example, ADC resolution may be adjusted down to take advantage of improved channel SNR (e.g., as a result of lower loss conditions) or adjusted up to lower quantization noise to enable the transceiver to handle more channel loss and still maintain a target SNR.

Figure 8:
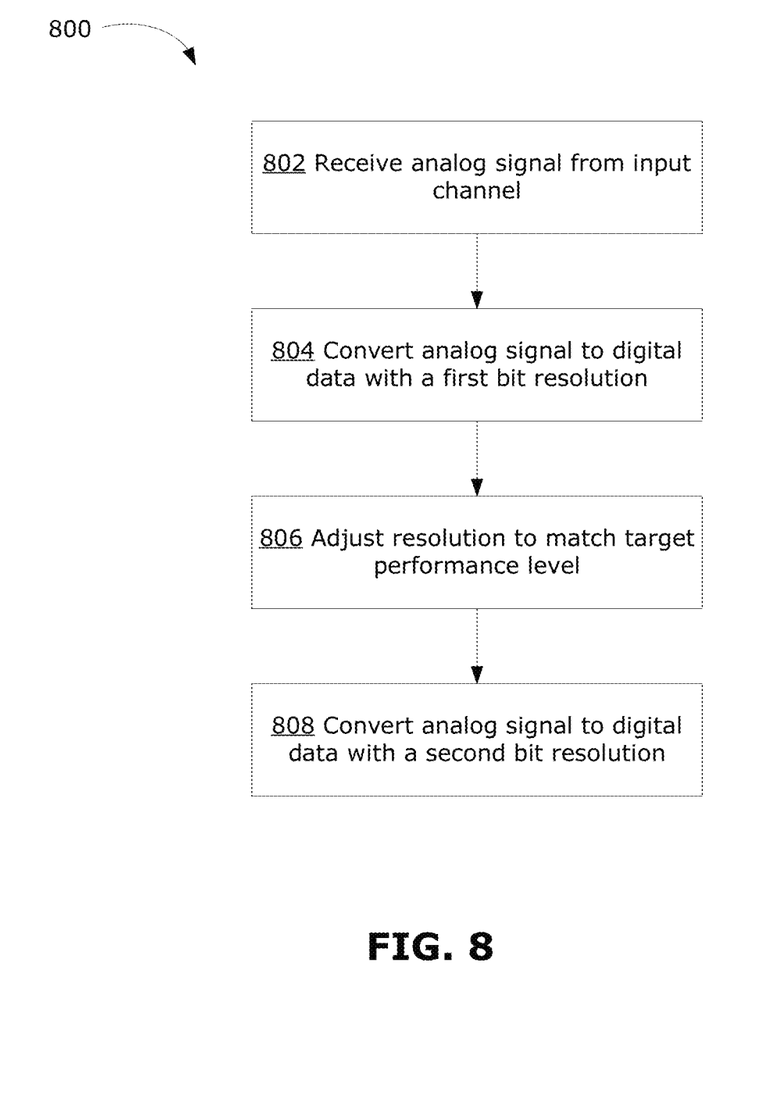
FIG. 8 is a flowchart illustrating an example method for dynamic resolution adjustment of an ADC.

FIG. 8 is a flowchart illustrating an example method 800 for dynamic resolution adjustment of an ADC. The method 800 may be implemented by a receiver with an interleaved ADC, for example as described with reference to FIG. 2. For simplicity, the method 800 may be described below with reference to an ADC in general, however it should be understood that the method 800 may be implemented by each sub-ADC of an interleaved ADC.

At 802, an analog signal is received from an input channel of the receiver.

At 804, the analog signal is converted to digital data at a first resolution setting. For an interleaved ADC, the analog signal may be sampled over multiple sub-ADCs and each sub-ADC outputs respective digital data. Each sub-ADC may have a respective bit resolution. Each sub-ADC may be capable of the same maximum resolution.

At 806, the bit resolution of the ADC is adjusted to match a target performance level. This may be carried out by sampling the digital data, calculating a performance indicator for the digital data, comparing the calculated performance indicator against the target performance level, and adjusting the resolution of the ADC with a control signal, for example as described with reference to FIG. 9 below.

At 808, the ADC continues conversion of the analog signal to digital data at the adjusted bit resolution, which may be higher or lower than the bit resolution at 804. It should be noted that the continued conversion of the analog signal at 808 does not re-convert the analog signal that was already converted at 804, but rather is continued conversion of the incoming unconverted analog input stream.

The adjustment of resolution of the ADC may be carried out during normal operation (e.g., mission mode). This may enable the ADC to adjust to changing channel characteristics and/or environmental changes, and help to ensure that performance requirements are met as well as providing power savings. The digital data output from the ADC may thus have dynamically changing bit resolution over time, during normal operation.

Figure 9:
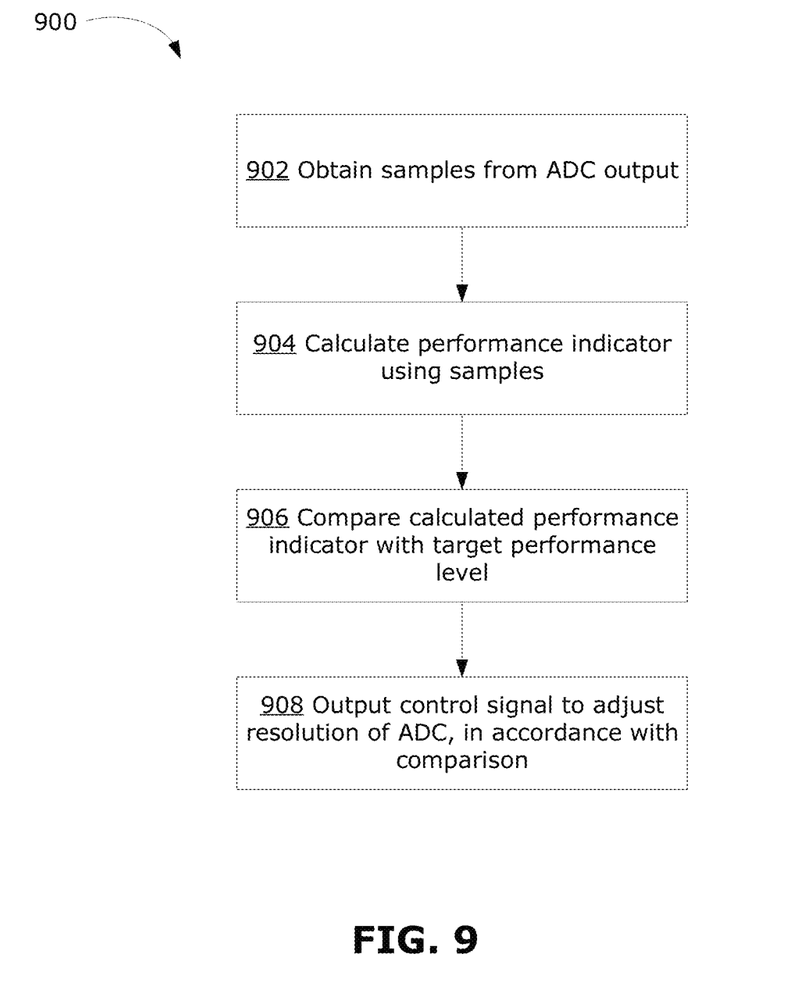
FIG. 9 is a flowchart illustrating an example method for controlling resolution of an ADC.

FIG. 9 is a flowchart illustrating an example method 900 for controlling resolution of an ADC. The method 900 may be performed by the statistical unit 210 described above, for example, in order to adjust the resolution of the ADC as described at 806 above.

At 902, the statistical unit obtains samples from the digital data output of the ADC. In the case of an interleaved ADC, the digital data output by each sub-ADC of the ADC is sampled.

At 904, the statistical unit calculates at least one performance indicator (e.g., SNR and/or BER) using the samples. The performance indicator may be calculated for each sub-ADC individually, for all sub-ADCs together, or both. For example, the SNR calculation described with reference to FIGS. 5 and 6 may be used.

At 906, the calculated performance indicator(s) is compared with a target performance level. As described above, the target performance level may be fixed or variable, and may be applicable to each sub-ADC individually, to all sub-ADCs together, or both.

If the performance indicator(s) indicate that the performance of the ADC is at the target performance level (or within an acceptable range, such as +/-10%), then it is not necessary to adjust resolution of the ADC and the method 900 may end. The target performance level may define a target performance range, which may be a wide enough range to avoid excessive changes to ADC resolution and to avoid the possibility that the target performance level cannot be satisfied. For example, if the target performance level is defined as a single target value, a 5-bit resolution may be insufficient to meet the target performance and a 6-bit resolution may exceed the target performance, thus possibly resulting in the ADC resolution being repeatedly changed between 5-bit and 6-bit resolution.

If the performance indicator(s) indicate that the performance of the ADC is not within the target performance range (e.g., performance is better by more than 10% or worse by more than 10%), then at 908 the statistical unit outputs a control signal to adjust the resolution of the ADC. The control signal may be generated in accordance with the results of the comparison at 906. For example, if the performance indicator(s) indicate that the performance of the ADC is better than the target performance level, the control signal may cause the resolution of the ADC to be lowered. In some examples, the target performance level may also be referred to as a target performance range, and may be a range of values rather than a single target value.

The control signal may be used to control the bit resolution of a SAR ADC by controlling the number of comparisons made by the comparator of the SAR ADC, for example as described above with reference to FIGS. 3 and 4.

In some examples, the method 900 may be carried out periodically, continuously or asynchronously (e.g., triggered by an event).

Although method 900 may be described above with reference to a single ADC output, the method 900 may be implemented for controlling resolution of the sub-ADCs of an interleaved ADC. In such a case, the method 900 may be performed by a single statistical unit for multiple sub-ADCs of the interleaved ADC, or the method 900 may be performed by multiple statistical units, each statistical unit controlling resolution of a respective sub-ADC.

In the examples discussed above, the performance indicator may be a SNR and/or BER calculated from the sampled output of the ADC. BER may be calculated to determine the ultimate bit error status of a channel, and may take into account factors such as pre-forward error correction (FEC) BER and FEC decoding fail, for example. SNR, on the other hand, does not depend on which FEC is used.

Thus, SNR may provide a generic statistical measure of ADC performance, and may be compared with a target SNR, in order to meet a target BER. Additionally, SNR may be calculated for each sub-ADC of an interleaved ADC (discussed further below), which may provide a more precise control of performance. Although SNR may provide a useful local statistical measure of received symbol power to noise power (e.g., based on a sequence of PAM-4 symbols), BER may provide a an assessment of the sub-ADCs as a group, for example by providing an assessment of the stream of bits that have all be demodulated from every sub-ADC channel. BER may also be calculated to determine the number of bits required to meet the target BER requirement of the overall system, in addition to the requirement of a single interleaved ADC. Although the target BER may be the overall target performance level of the system, a significant amount of time may be needed to obtain enough samples for the calculated BER to be statistically significant with high confidence, particularly where channels have good performance. In addition, the provision of BER may be quantized at times, across different numbers of ADC bits that are used. SNR, in contrast, may provide a less quantized (or more finely quantized) measure of performance across different numbers of ADC bits, and usually can be calculated more quickly. Generally, SNR may be used when considering the performance of individual sub-ADCs, and BER may be calculated for the total data stream from all sub-ADCs.

In some examples, the disclosed methods and systems may be used to control bit resolution of an ADC only during initiation or system reset. In some examples, the bit resolution of an ADC may only be controlled during regular operation (e.g., mission mode). In some examples, the bit resolution of an ADC may be controlled both at initialization/reset and dynamically during operation.

The examples described herein may be applicable to high-end (as well as non-high-end) ADC-based receivers for serial communication integrated circuits (ICs), for example for use in computing, datacenter or switching/router systems. Such systems typically have very high channel counts per IC. Conventionally, a common fixed N-bit ADC design is used for all channels of a single IC. However, the loss per channel and SNR per channel tends to vary significantly in these systems. Thus, using a fixed N-bit ADC, which is typically designed to account for the worst case channels, means that the ADC is over-designed for the average link, resulting in excess power consumption. For example, in a switching/router infrastructure IC where the channel count can exceed 150 channels, it may be that only 25 channels require 7-bit resolution and lower resolution (e.g., 5-bit resolution) would satisfy the requirements of the remaining 125 channels. The power consumption difference between an ADC operating at 7-bit resolution and one operating at 5-bit resolution can be as much as 20 mW. Using examples disclosed herein, the ADC resolution for the 125 channels requiring lower resolution may be set at 5-bits, independently of the 25 channels requiring a higher resolution. The total power savings may thus be about 125×20 mW=2.5 W. This represents a significant power saving at IC level.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A system for dynamically controlling resolution of an analog-to-digital converter (ADC), the system comprising:
   the ADC for receiving an analog input signal and outputting digital data; and
   a statistical unit coupled to the ADC for obtaining samples of the output signal and transmitting a control signal to the ADC to dynamically control operation of the ADC, in order to adjust the resolution of the ADC during operation, the control signal being generated by the statistical unit based on a comparison of at least one performance indicator with a target performance level, the at least one performance indicator being calculated using the samples.

2. The system of claim 1, wherein the ADC is an interleaved ADC having multiple sub-ADCs, each sub-ADC outputting respective digital data, and wherein the statistical unit obtains samples of the digital data output from each sub-ADC, calculates at least one performance indicator for each sub-ADC, and transmits the control signal to adjust the resolution of each sub-ADC independently of each other sub-ADC.

3. The system of claim 1, wherein the ADC is an interleaved ADC having multiple sub-ADCs, each sub-ADC outputting respective digital data, and wherein the statistical unit obtains samples of the digital data output from each sub-ADC, calculates a group performance indicator for the sub-ADCs, and transmits the control signal to adjust the resolution of the sub-ADCs as a group.

4. The system of claim 1, wherein the at least one performance indicator includes at least one of a signal-to-noise ratio (SNR) or a bit error rate (BER).

5. The system of claim 1, wherein the ADC is a successive approximation ADC having a resolution, wherein the control signal adjusts the resolution of the ADC by controlling a number of comparisons performed by a comparator of the successive approximation ADC.

6. The system of claim 5, further comprising a resolution control circuit for controlling the number of comparisons, wherein the resolution control circuit is configured to:
   count the number of comparisons performed by the comparator; and
   stop comparisons by the comparator when the number of comparisons performed by the comparator reaches a bit resolution specified by the control signal.

7. A transceiver device comprising:
   a transmitter for transmitting an output signal; and
   a receiver for receiving an analog input signal on an input channel, the receiver comprising:
      an analog-to-digital converter (ADC) for converting the analog input signal to digital data; and
      a statistical unit coupled to the ADC for obtaining samples of the digital data and transmitting a control signal to the ADC to dynamically control operation of the ADC, in order to adjust the resolution of the ADC during operation, the control signal being generated by the statistical unit based on a comparison of at least one performance indicator with a target performance level of the receiver, the at least one performance indicator being calculated using the samples.

8. The device of claim 7, wherein the ADC is an interleaved ADC having multiple sub-ADCs, each sub-ADC outputting respective digital data, and wherein the statistical unit obtains samples of the digital data output from each sub-ADC, calculates at least one performance indicator for each sub-ADC, and transmits the control signal to adjust the resolution of each sub-ADC independently of each other sub-ADC.

9. The device of claim 7, wherein the ADC is an interleaved ADC having multiple sub-ADCs, each sub-ADC outputting respective digital data, and wherein the statistical unit obtains samples of the digital data output from each sub-ADC, calculates a group performance indicator for the sub-ADCs, and transmits the control signal to adjust the resolution of the sub-ADCs as a group.

10. The device of claim 7, wherein the at least one performance indicator includes at least one of a signal-to-noise ratio (SNR) or a bit error rate (BER).

11. The device of claim 7, wherein the ADC is a successive approximation ADC having a resolution, wherein the control signal adjusts the resolution of the ADC by controlling a number of comparisons performed by a comparator of the successive approximation ADC.

12. The device of claim 11, wherein the receiver further comprising a resolution control circuit for controlling the number of comparisons, wherein the resolution control circuit is configured to:
   count the number of comparisons performed by the comparator; and
   stop comparisons by the comparator when the number of comparisons performed by the comparator reaches a bit resolution specified by the control signal.

13. A method for dynamically adjusting resolution of an analog-to-digital converter (ADC), the method comprising:
   receiving an analog input signal from an input channel;
   converting the analog signal to digital data at a first bit resolution;
   controlling operation of the ADC to dynamically adjust resolution of the ADC, during operation, to match a target performance level; and
   continuing conversion of the analog signal at a second bit resolution.

14. The method of claim 13, wherein adjusting resolution of the ADC comprises:
   obtaining samples of the digital data at the first bit resolution;
   calculating a performance indicator using the samples;
   comparing the calculated performance indicator with the target performance level; and
   generating a control signal, based on the comparison, to adjust the resolution of the ADC.

15. The method of claim 13, wherein the ADC is an interleaved ADC having multiple sub-ADCs, each sub-ADC outputting respective digital data, and adjusting the resolution comprises adjusting resolution of each sub-ADC independently of each other sub-ADC.

16. The method of claim 15, wherein the resolution of each sub-ADC is adjusted to match a respective target performance level for each sub-ADC.

17. The method of claim 13, wherein the ADC is an interleaved ADC having multiple sub-ADCs, each sub-ADC outputting respective digital data, and adjusting the resolution comprises adjusting the resolution of the sub-ADCs together.

18. The method of claim 17, wherein the target performance level is a group target performance level.

19. The method of claim 13, wherein the target performance level includes at least one of a target signal-to-noise ratio (SNR) or a target bit error rate (BER).

20. The method of claim 13, wherein the ADC is a successive approximation ADC, wherein adjusting the resolution of the ADC comprises controlling number of comparisons performed by a comparator of the successive approximation ADC.

* * * * *